US009250280B2

(12) United States Patent
Miar et al.

(10) Patent No.: US 9,250,280 B2
(45) Date of Patent: Feb. 2, 2016

(54) MULTIRESOLUTION BASED POWER SPECTRAL DENSITY ESTIMATION

(71) Applicant: University of Ottawa, Ottawa (CA)

(72) Inventors: Yasin Miar, Ottawa (CA); Claude Denis D'Amours, Russell (CA); Tyseer Aboulnasr, Ottawa (CA)

(73) Assignee: UNIVERSITY OF OTTAWA, Ottawa (CA)

( * ) Notice: Subject to any disclaimer, the term of this patent is extended or adjusted under 35 U.S.C. 154(b) by 0 days.

(21) Appl. No.: 14/357,770

(22) PCT Filed: Jun. 26, 2013

(86) PCT No.: PCT/CA2013/050498
§ 371 (c)(1),
(2) Date: May 13, 2014

(87) PCT Pub. No.: WO2014/205539
PCT Pub. Date: Dec. 31, 2014

(65) Prior Publication Data
US 2015/0233991 A1    Aug. 20, 2015

(51) Int. Cl.
*G06F 19/00* (2011.01)
*G01R 29/26* (2006.01)

(52) U.S. Cl.
CPC ..................... *G01R 29/26* (2013.01)

(58) Field of Classification Search
CPC . G06T 5/002; G06T 5/10; G06T 2207/20064; G06T 7/0079; G06T 2207/20016; G06F 11/3058; G06F 11/3051; G05B 23/024; H04W 24/02; H04W 16/22; H04W 16/14; H04W 16/18; G10L 19/022
USPC .............................. 702/58, 60, 191
See application file for complete search history.

(56) References Cited

U.S. PATENT DOCUMENTS

| 7,010,376 B2* | 3/2006 | Ettaleb et al. ............... 700/111 |
| 8,095,359 B2* | 1/2012 | Boehm et al. ............... 704/203 |

(Continued)

FOREIGN PATENT DOCUMENTS

| CN | 102638810 A  *  8/2012 |
| WO | 2013006653 A1    1/2013 |

OTHER PUBLICATIONS

Cabric, D., et al., "Implementation Issues in Spectrum Sensing for Cognitive Radios," Conference Record of the Thirty-Eighth Asilomar Conference on Signals, Systems and Computers, vol. 1, pp. 772-776 (2004).

(Continued)

*Primary Examiner* — Carol S Tsai
(74) *Attorney, Agent, or Firm* — Turk IP Law, LLC

(57) ABSTRACT

Technologies are generally described for multi-resolution based power spectral density estimation. According to some examples, a first power spectral density (PSD) of a signal may be computed to determine a first frequency resolution and a first error variance (EV) value associated with the PSD. The first PSD may be computed using fewer segments of the signal to achieve a higher resolution. The higher resolution is associated with a higher EV because of the fewer segments used for the computation of the first PSD. Next, a second PSD may be computed using the signal while sampling more segments to determine second resolution and EV. The second PSD may be associated with a lower EV because of the additional segments used for the computing of the second PSD. Missing frequency variables of the second PSD may be determined using the first resolution and the second EV through an expectation maximization technique.

20 Claims, 7 Drawing Sheets

(56) References Cited

U.S. PATENT DOCUMENTS

| | | | |
|---|---|---|---|
| 8,296,108 B2* | 10/2012 | Tanaka | 703/2 |
| 8,762,080 B2* | 6/2014 | Vaidyanathan et al. | 702/58 |
| 2004/0088058 A1* | 5/2004 | Ettaleb et al. | 700/26 |
| 2009/0012797 A1* | 1/2009 | Boehm et al. | 704/501 |
| 2010/0067710 A1 | 3/2010 | Hendriks et al. | |
| 2012/0158326 A1* | 6/2012 | Vaidyanathan et al. | 702/60 |
| 2013/0051674 A1* | 2/2013 | Goossens et al. | 382/173 |
| 2013/0310093 A1* | 11/2013 | Giannakis et al. | 455/501 |

OTHER PUBLICATIONS

Harjula, I., et al., "Spectrum sensing in cognitive femto base stations using Welch periodogram," IEEE 22nd International Symposium on Personal Indoor and Mobile Radio Communications (PIMRC), pp. 2305-2309 (2011).

Haykin, S., "Cognitive radio: brain-empowered wireless communications," IEEE Journal on Selected Areas in Communications, vol. 23, Issue 2, pp. 201-220 (2005).

Kim, J., "SON and Femtocell Technology for LTE-Advanced System," Sixth International Conference on Wireless and Mobile Communications, pp. 286-290 (2010).

Lexa, M., et al., "Compressive Power Spectral Density Estimation," IEEE International Conference on Acoustics, Speech and Signal Processing, pp. 3884-3887 (2011).

Lu, L., et al., "Ten years of research in spectrum sensing and sharing in cognitive radio," EURASIP Journal on Wireless Communications and Networking, vol. 2012, No. 28, pp. 1-16 (2012).

Vaniček, P., "Approximate Spectral Analysis by Least-Squares Fit," Astrophysics and Space Science, vol. 4, Issue 4, pp. 387-391 (1969).

Welch, P.D., "The Use of Fast Fourier Transform for the Estimation of Power Spectra: A Method Based on Time Averaging Over Short, Modified Periodograms," IEEE Transactions on Audio and Electroacoustics, vol. 15, Issue 2, pp. 70-73 (1967).

International Search Report with Written Opinion for International Application No. PCT/CA2013/050498 mailed on Mar. 5, 2014.

* cited by examiner

MULTIRESOLUTION BASED POWER SPECTRAL DENSITY ESTIMATION

CROSS-REFERENCE TO RELATED APPLICATION

This Application is the National Stage filing under 35 U.S.C. §371 of PCT Application Ser. No. PCT/CA13/50498 filed on Jun. 26, 2013. The PCT Application is hereby incorporated by reference in its entirety.

BACKGROUND

Unless otherwise indicated herein, the materials described in this section are not prior art to the claims in this application and are not admitted to be prior art by inclusion in this section.

Power spectral density (PSD) estimation has wide applications in industry. Spectrum sensing in cognitive radio (CR) demands an accurate determination of PSD of a signal. CR improves spectrum utilization by allowing secondary users to access unused licensed spectrum. The unused sub-bands are found using spectrum sensing. Accurate PSD estimation is also in demand with femto-cell base stations in self-organizing networks for next generation cellular wireless technology.

A first step in spectrum sensing is the power spectral density (PSD) estimation. Conventional Welch's method was proposed for spectrum sensing for CR. Welch's method is an example of Discrete Fourier Transform (DFT) based PSD estimation. In Welch's method, the received signal samples are segmented into a few segments. The estimated PSD is achieved by linearly averaging the periodograms of all segments. Additional averaging (i.e. additional segments) leads to lower estimation variance of the PSD. Alternatively, longer segments lead to a better frequency resolution. Therefore, for the same number of received signal samples, there is a trade-off between estimation accuracy and frequency resolution.

SUMMARY

The present disclosure generally describes techniques for multi-resolution based power spectral density (PSD) estimation to detect spectrum usage in highly dynamic environments and improve detection of sub-band edges.

According to some examples, a method is provided for multi-resolution based PSD estimation. The method may include computing a first PSD of a signal to determine a first resolution and a first error variance (EV) value associated with the first PSD; computing a second PSD of the signal to determine a second resolution and a second EV value associated with the second PSD; and determining missing frequency variables of the second PSD using the first resolution and the second EV through an expectation maximization technique.

According to other examples, a controller is provided for multi-resolution based PSD estimation. The controller may include an expectation maximization module. The expectation maximization module may be configured to compute a first PSD of a signal to determine a first resolution and first error variance (EV) value associated with the first PSD; computer a second PSD of the signal to determine a second resolution and a second EV value associated with the second PSD; determine missing frequency variables of the second PSD using the first resolution and the second EV through an expectation maximization technique; and determine an average value for the second PSD over consecutive non-overlapping segments of the signal.

According to further examples, a computing device is provided for multi-resolution based PSD estimation. The device may include a controller managing an expectation management module. The controller may be configured to compute a first PSD of a signal to determine a first resolution and a first error variance (EV) value associated with the first PSD, computer a second PSD of the signal to determine a second resolution and a second EV value associated with the second PSD; determine missing frequency variables of the second PSD using the first resolution and the second EV through and expectation maximization technique; determine an average value for the second PSD over consecutive non-overlapping segments of the signal; compute and integer value for the average value; and assign the integer value to a noise level value in response to determining the integer value as a mode value of the second PSD based on a predetermined spectrum assumption of a cognitive radio associated with the signal.

According to some examples, a computer readable medium may store instructions for multi-resolution based PSD estimation. The instructions may cause a method to be performed when executed, the method being similar to the methods described above.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawing. Understanding that these drawings depict only several embodiments in accordance with the disclosure and are, therefore, not to be considered limiting of its scope, the disclosure will be described with additional specificity and detail through use of the accompanying drawings, in which:

Figure 1:
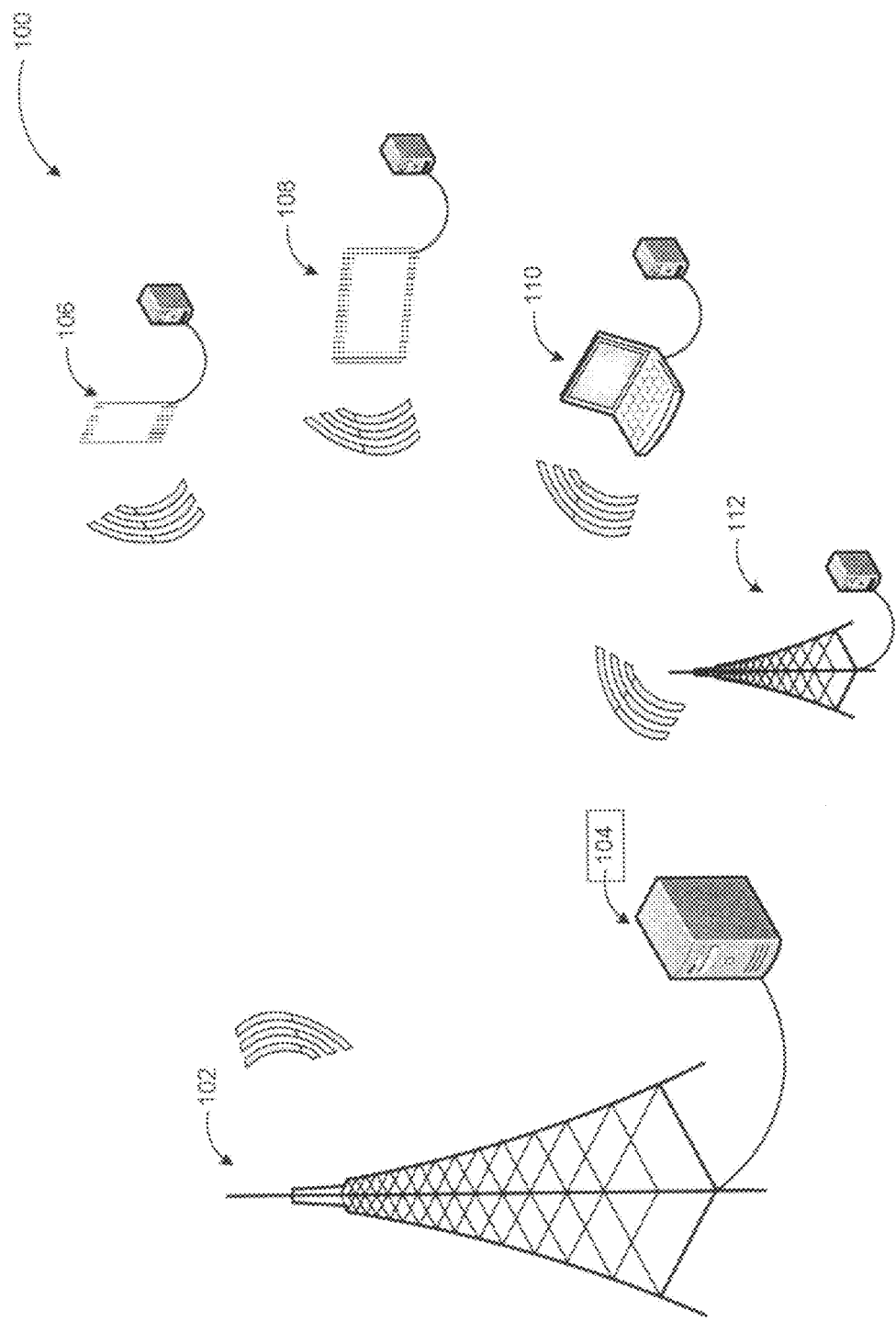
FIG. 1 illustrates an example wireless system where estimation of multi-resolution based power spectral density (PSD) may be implemented.

all arranged in accordance with at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit of the scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatuses, systems, devices, and/or computer program products related to multi-resolution based power spectral density estimation.

Briefly stated, technologies are generally described for multi-resolution based power spectral density estimation to detect spectrum usage in highly dynamic environments and improve detection of sub-band edges. According to some examples, a first power spectral density (PSD) of a signal may be computed to determine a first frequency resolution and a first error variance (EV) value associated with the PSD. The first PSD may be computed using fewer segments of the signal to achieve a higher resolution. The higher resolution is associated with a higher EV because of the fewer segments used for the computation of the first PSD. Next, a second PSD may be computed using the signal while sampling more segments to determine second resolution and EV. The second PSD may be associated with a lower EV because of the additional segments used for the computing of the second PSD. Missing frequency variables of the second PSD may be determined using the first resolution and the second EV through an expectation maximization technique.

FIG. 1 illustrates an example wireless system where estimation of multi-resolution based power spectral density (PSD) may be implemented, arranged in accordance with at least some embodiments described herein.

Diagram 100 shows mobile devices communicating by transmitting signals through a wireless network. The mobile devices may communicate with a base station such as a wireless network antenna 102. Antenna 102 may facilitate wireless communication among the mobile devices through a wired or a wireless network. The mobile devices may include a multitude of devices capable of communicating with the antenna wirelessly including a mobile phone 106, a tablet 108 and a laptop computer 110. Examples of mobile devices are not provided in a limited sense, any device having an antenna and control electronics capable of receiving and sending signals to the antenna 102 may communicate through a wireless network established through the antenna 102.

A controller 104 may manage signal analysis and transmission through the antenna 102. The controller 104 may sample segments of received signals for multi-resolution based PSD estimation. As discussed previously, the controller 104 may sample a low number of segments in the signal to compute a high frequency resolution for an initial PSD having a high EV value because of the low number sampled segments. A second computed PSD may have a low EV value as a result a high number of sampled segments in the signal. The controller 104 may then computer missing frequency variables of the second PSD using the first determined resolution and the second EV value through an expectation maximization technique.

Additionally, a wireless network facilitated by antenna 102 may be extended through additional base stations such as wireless network antenna 112. The antenna 112 may communicate with the antenna 102 through its own controller to transmit communications from and to the antenna 102 and wirelessly connected devices. In an embodiment, the antenna 102 may not be connected to a wired network and may transmit communications from and to mobile devices through transmissions sent and received through antenna 112. Alternately, the antenna 112 may not be connected to wired network and the controller of the antenna 102 may facilitate transmission and communications from and to the antenna 112. In yet another embodiment, both antennas 102 and 112 may be part of a cellular network providing wireless signal based communication to variety of mobile devices through network management implemented by their respective controllers.

Figure 2:
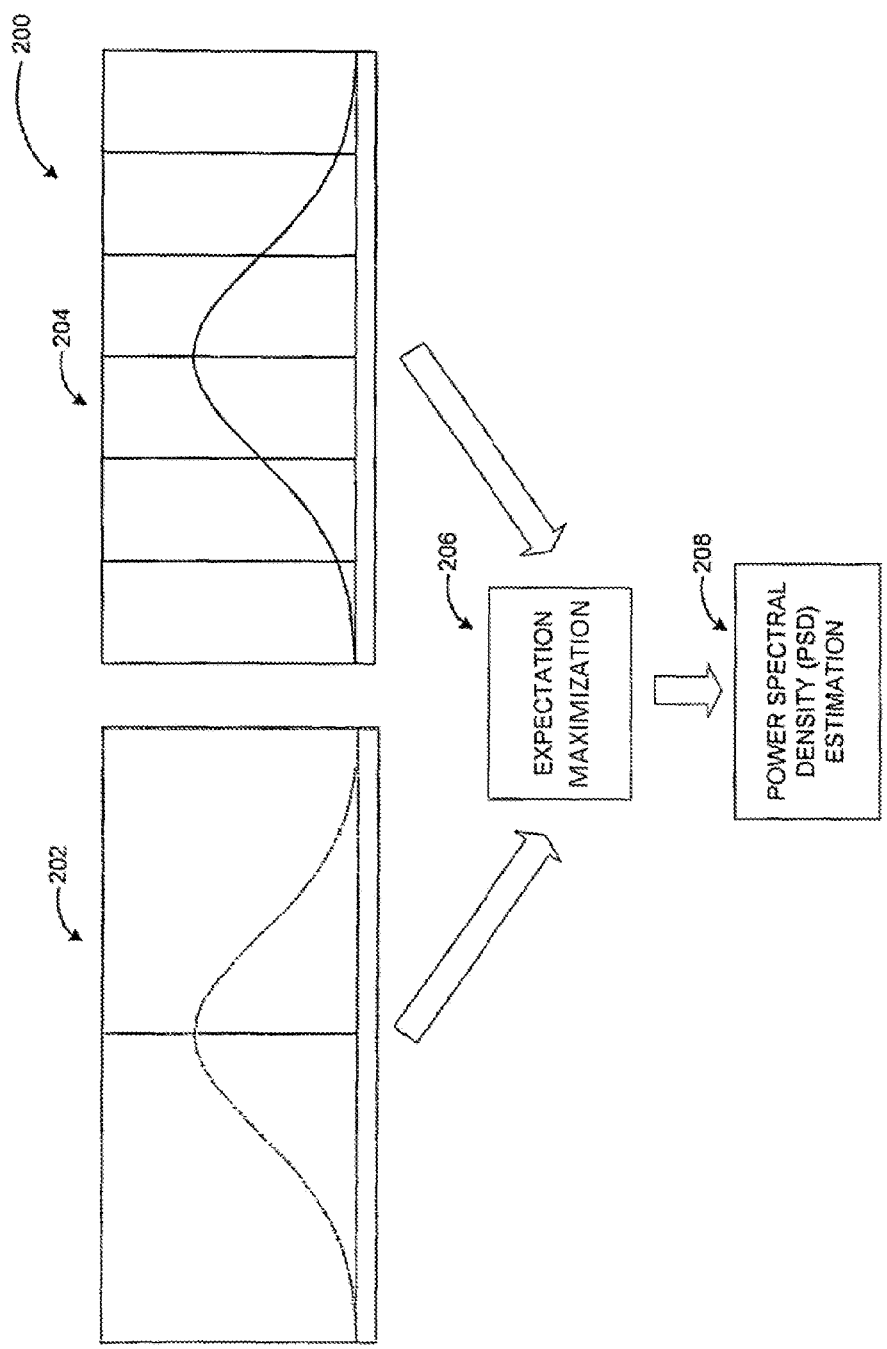
FIG. 2 illustrates an example schema implementing estimation of multi-resolution based PSD.

FIG. 2 illustrates an example schema implementing estimation of multi-resolution based PSD, arranged in accordance with at least some embodiments described herein.

Diagram 200 shows an example use of expectation maximization 206 to compute PSD estimation 208. Conventional solutions use Welch's method to compute PSD of an electromagnetic signal. Welch's method include additional sensing time with more EV compared to embodiments.

In Welch's method, the received signal samples are segmented into M segments of length N. The estimated PSD (S) is achieved by linearly averaging the periodograms of all segments as:

$$S = \frac{1}{M} \sum_m S_m \qquad [1]$$

where $S_m$ is the mth segment's periodogram. The periodogram of each segment is given by $$S_m = \frac{|X_m|^2}{N}, \qquad [2]$$

where $X_m$ is the discrete fourier transform (DFT) sequence of the mth segment defined as $$X_m = [N_{m1}, N_{m2}, \ldots, N_{mN}], \text{ and} \qquad [3]$$

$$|X_m|^2 = [|N_{m1}|^2, |N_{m2}|^2, \ldots, |N_{mN}|^2] \qquad [4]$$

The estimation EV value of Welch's method is inversely proportional to the number of segments (M) involved in the averaging process:

$$\sigma_S^2 \cong \frac{\sigma_{S_m}^2}{M} \qquad [5]$$

in which $\sigma_s^2$ represents the EV value of Welch's method and $\sigma_{S_m}^2$, is the variance in mth segment's periodogram.

Spectrum edges of the signal may be detected upon estimation of the PSD. Embodiments modify a window based edge detection technique. In an example embodiment.

1) An estimated PSD (in dB scale) of a signal may be averaged over consecutive non-overlapping windows.
2) An integer value of the window-averaged PSD level may be computed.
3) Based on a low spectrum occupancy assumption in cognitive radio (CR), a most frequent integer of the window-averaged PSD may be assumed to be a noise level of the signal.
4) Each energy level of sub-bands of the signal may be determined by computing an area under the PSD curve between consecutive noise levels.

5) Frequencies associated to the noise levels around the largest areas may be considered to be the approximate frequencies of the edges.

6) Exact edge frequencies may be detected by locating a minimum value and a maximum value of a first derivative of the PSD within the specified window.

In an example scenario, a signal may be divided to two segments 202 to compute a first PSD with a high resolution accompanied by high EV value as a result of the few number of segments. Next, the signal may be divided into additional segments 204 to compute a second PSD with a low EV value. Expectation maximization technique 206 may be applied to the high resolution of the first PSD and the low EV value of the second PSD to determine missing frequency variables of the second PSD. Each energy level of sub-bands of the signal may be determined by computing an area under the second PSD curve between consecutive noise levels. Additionally, frequencies associated to the noise levels around largest areas may be considered to be the approximate frequencies of the edges of the signal during PSD estimation 208.

Figure 3:
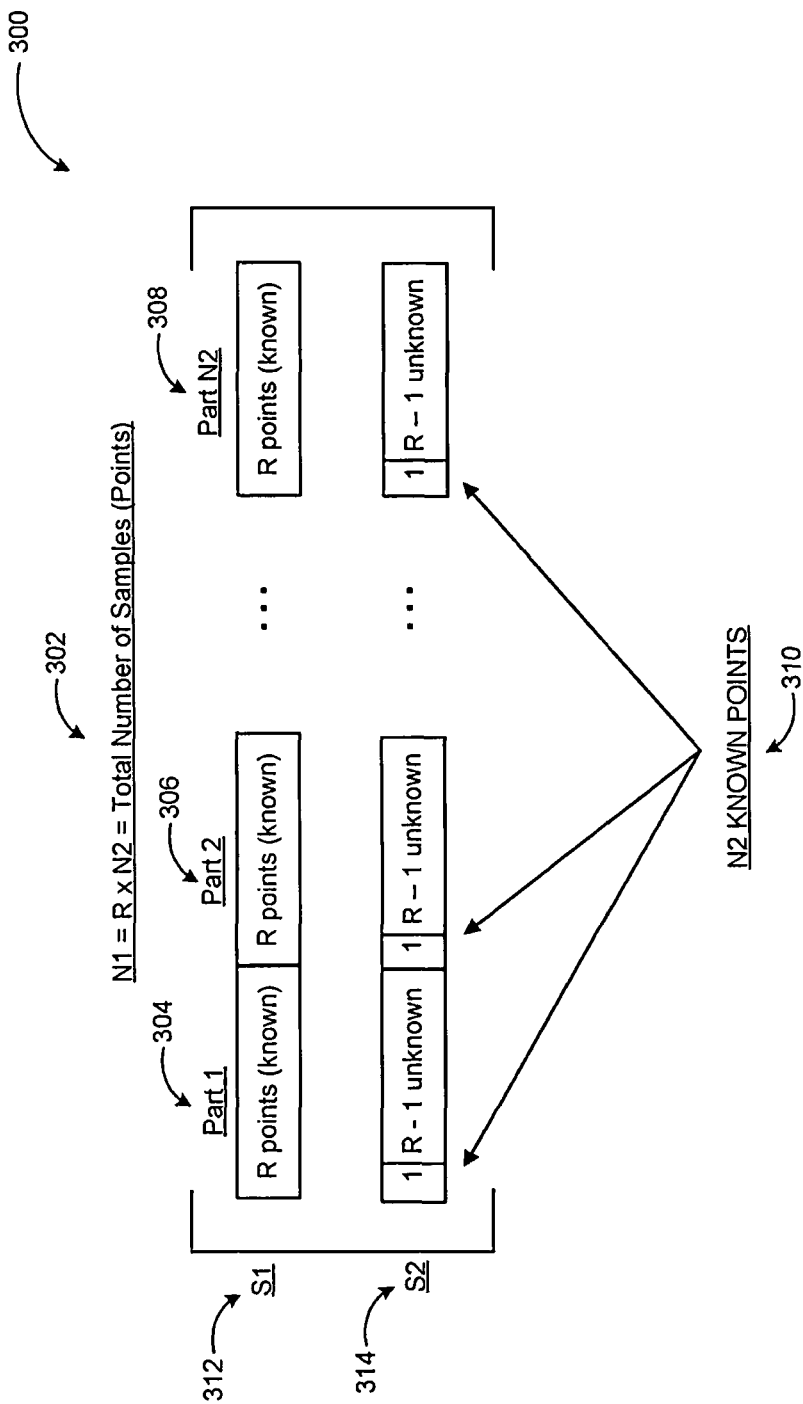
FIG. 3 illustrates an example scenario of multi-resolution based PSD estimation.

FIG. 3 illustrates an example scenario of multi-resolution based PSD estimation, arranged in accordance with at least some embodiments described herein.

Diagram 300 shows multiple example scenarios of resolutions for PSD estimation. A PSD estimation process may include an expectation maximization (EM) algorithm. The EM algorithm may compute maximum likelihood of parameters of a stochastic model with missing frequency variables. The EM algorithm is an iterative technique that may include:

1) Computing an expected value of a log-likelihood function of a conditional probability distribution of the missing frequency variables compared to observed frequency variables. The expected value may be the current estimate of the missing frequency variables.

2) Maximizing the distribution of the missing frequency variables with respect to the parameters of the estimation such as a mean, a variance, and a co-variance of the log-likelihood function. The parameters maximizing the distribution may be used for a next expectation step.

3) Iterating step 1 and 2 until convergence.

4) Computing the maximum likelihood estimation of the missing frequency variables after convergence.

According to some embodiments, in a PSD estimation process, two scenarios may be evaluated with variety of resolutions with M number of segments where M2>M1. In a first example scenario, M1 segments of N1 points of the received signal samples may be used to compute a first PSD with N1 frequency variables. Using the same set of received signal samples, in a second example scenario, M2 segments of N2 of points of the received signal samples are considered to compute a second PSD with N2 frequency variables where $$M1 \times N1 = M2 \times N2. \quad [6]$$

It may be assumed that N1=R×N2 where R represents the multi-resolution ration between the two scenarios. R is considered to be an integer of a power of two R=$2^s$, n≥1. Therefore, in the first scenario, a first PSD with a higher resolution and a higher EV value may be computed as averaging over fewer segments, as previously discussed. In the second scenario, a second PSD with a lower resolution and a lower EV value may be computed.

The second PSD computed in the second scenario may be more accurate than the first PSD computed by the first scenario. The first PSD computed in the first scenario may equal the second PSD computed in the second scenario plus an estimation noise due to less averaging in the first scenario. As a result, $$S1=S2+G. \quad [7]$$

in which G is an estimation noise. G may be assumed to have a Gaussian distribution. A joint probability density function of scenario S1 and S2 may be assumed to exhibit a bi-variate Gaussian distribution. The first scenario S1 has N1 points in the frequency variable while the second scenario S2 has N2 points in the frequency variable (N1>N2). The remaining points of S2 scenario (N1-N2 points) may be computed by applying EM algorithm while computing the first and the second PSDs (assuming the first and the second PSDs having a joint probability density function of bi-variate Gaussian distribution).

Diagram 300 illustrates the two scenarios for PSD estimation with varied resolutions and EV values. In the first scenario, S1 (312) has N2 parts 304, 306, 308 of R known points each (a total of N1 points 302). In the second scenario S2 (314), each part has 1 known point, N2 known points 310, and R−1 unknown parts. S1 (312) has more known points with higher EV while S2 (314) has fewer known frequency variables (shown by "1" in each part of R points) with lower EV. The goal of the EM algorithm may be to estimate the remaining unknown points of S2 (314) using the unknown points associated with known frequency variables in S1 (312) with lower EV as if computed frequency variables are averaged over M2 segments (M2>M1).

According to other embodiments, a joint probability density function of $s_1$ and $s_2$ may be assumed to exhibit a bi-variate Gaussian distribution. The function may include $$P(s_1, s_2) = \frac{1}{2\pi\sqrt{\sigma_{s_1}^2 \sigma_{s_2}^2 - \sigma_{s_1,s_2}^2}} \times \quad [8]$$

$$e^{-\frac{\sigma_{s_2}^2(s_1-\mu_1)^2 - 2\sigma_{s_1,s_2}^2(s_1-\mu_1)(s_2-\mu_2) + \sigma_{s_1}^2(s_2-\mu_2)^2}{2(\sigma_{s_1}^2 \sigma_{s_2}^2 - \sigma_{s_1,s_2}^2)}}$$

in which $\sigma_{s_1}^2$, $\sigma_{s_2}^2$ and $\sigma_{s_1,s_2}^2$, are the variances in $s_1$, $s_2$ and the covariance of $s_1$ and $s_2$, respectively, $\mu_1$ and $\mu_2$ are the mean values of $s_1$ and $s_2$.

The unknown points of S2 scenario may be estimated using the data given by the S1 scenario. The conditional probability density function $P(s_1 \cdot s_2)$ may be $$^{com}P(s_2 \mid s_1) = \frac{P(s_1, s_2)}{P(s_1)}, \quad [9]$$

The maximum likelihood function of $s_2$ with respect to $s_1$ may be computed when the first derivative of the logarithm of equation [9] with respect to $s_2$ equals zero.

$$\frac{\partial \ln(P(s_2 \mid s_1))}{\partial s_2} = \frac{\partial \ln(P(s_2, s_1))}{\partial s_2} - \frac{\partial \ln(P(s_1))}{\partial s_2} = 0. \quad [10]$$

The second term at the right hand side of the above equation [10] may be zero as $P(s_1)$ is not a function of $s_2$. Substituting equation [8] into equation [10] results in:

$$s_2 - \mu_2 = \frac{\sigma_{s_1,s_2}^2}{\sigma_{s_1}^2}(s_1 - \mu_1). \quad [11]$$

From known properties of Welch's method, $\mu_2 \cong \mu_2$ in equation [11] which results in:

$$s_2 = \mu_1 + \frac{\sigma_{s_1,s_2}^2}{\sigma_{s_1}^2}(s_1 - \mu_1). \quad [12]$$

The above equation [12] may be used to estimate the expected values of the unknown points of S2 scenario in the EM algorithm. The mean, variance, and the covariance values are computed locally over the pair parts of R+1 points.

In addition, complexity of high resolution low variance (HRLV), high resolution high variance (HRHV), low resolution low variance (LRLV) and EM-based PSD estimation methods are compared to Table 1 below. The complexity order of Welch's method may be given by O(N3) as defined in equation [3] and complexity order of EM algorithm may be given by 101NM in which 1 is the number of iterations. M is the number of received signal segments and N is the number of samples in each segment of the signal. In an example scenario, the complexity of EM-based PSD estimation is of the same order of both HRLV and HRHV.

TABLE I

COMPLEXITY COMPARISON TABLE OF HRLV, HRHV, LRLV AND EM-BASED PSD ESTIMATION METHODS

| Method | Complexity order |
| --- | --- |
| HRLV | $O(N_1^2)$ |
| HRHV | $O(N_1^3)$ |
| LRLV | $O(N_2^3)$ |
| EM-based | $O(N_1^2) - 10/N_1 M_1 \approx O(N_1^3)$ |

Embodiments may be implemented via combinations of hardware and software components. The software components may include existing or new communication or signaling systems, proposed to communicate information using multi-resolution based PSD estimation to detect spectrum usage in highly dynamic environments and improve detection of sub-band edges. Moreover, embodiments are not limited to cellular systems, but may be implemented in any PSD estimator used in any electronics system that requires a PSD estimator such as wireless networks, speech processors, (medical) image processors, and similar ones.

While embodiments have been discussed above using specific examples, components, scenarios, and configurations in FIG. 1, FIG. 2 and FIG. 3, they are intended to provide a general guideline to be used for implementing multi-resolution based PSD estimation. These examples do not constitute a limitation on the embodiments, which may be implemented using other components, optimization schemes, and configurations using the principles described herein. For example, other algorithms may be implemented than those provided as example.

Figure 4:
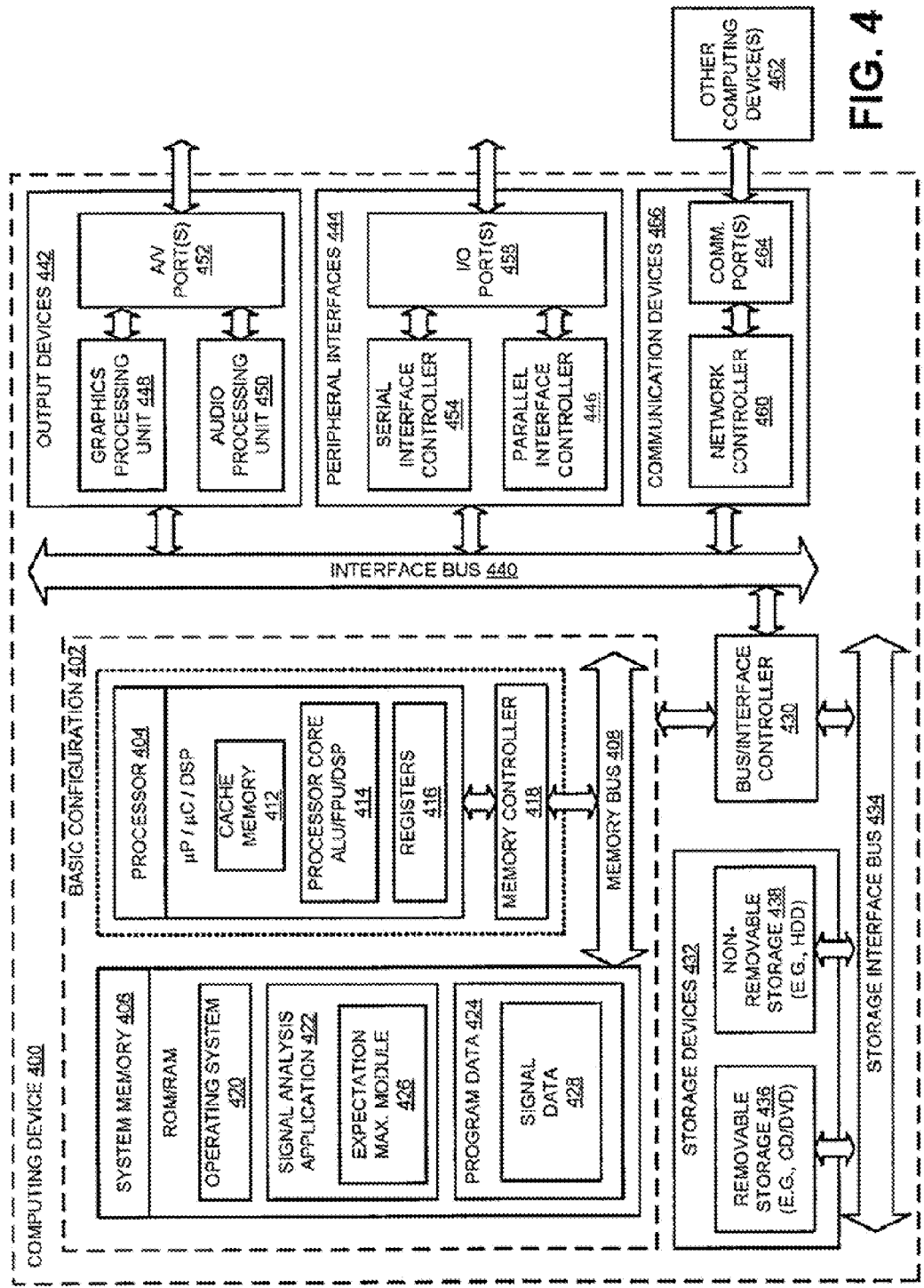
FIG. 4 illustrates a general purpose computing device, which may be used to implement multi-resolution based PSD estimation.

FIG. 4 illustrates a general purpose computing device, which may be used to implement multi-resolution based PSD estimation, arranged in accordance with at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (µP), a microcontroller (µC), a digital signal processor (DSP), or any combinations thereof. Processor 404 may include one more levels of caching, such as a cache memory 412, a processor core 414, and registers 416. Example processor core 414 may include an arithmetic logic unit (ALU), a floating point unit (EPU), a digital signal processing core (DSP Core), or any combination thereof. In an example, a memory controller 418 may also be used with processor 404, or in some implementations the memory controller 418 may be an internal part of processor 404.

Depending on the desired configuration, system memory 406 may be of any type including but not limited to volatile memory (such as RAM), non-volatile memory (such as ROM, flash memory, etc.) or any combinations thereof. System memory 406 may include an operating system 420, one or more signal analysis applications 422, and program data 424. Signal analysis application 422 may include an expectation maximization module 426 that is arranged to estimate multi-resolution based PSD through an expectation maximization technique. Program data 424 may include one or more of signal data 428 and similar data as discussed above in conjunction with at least FIG. 1, FIG. 2, and FIG. 3. This data may be useful for estimating PSD as is described herein. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communications devices 466) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 446, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 466 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a physical server, virtual server, a computing cloud, or a hybrid device that include any of the above functions. Computing device 400 may also be implemented as a personal computer including both laptop computer and non-laptop computer configurations. Moreover computing device 400 may be implemented as a networked system or as part of a general purpose or specialized server.

Networks for a networked system including computing device 400 may comprise any topology of servers, clients, switches, routers, modems, Internet service providers, and any appropriate communication media (e.g., wired or wireless communications). A system according to embodiments may have a static or dynamic network topology. The networks may include a secure network such as an enterprise network (e.g., a LAN, WAN, or WLAN), an unsecure network such as a wireless open network (e.g., IEEE 802.11 wireless networks), or a world-wide network such (e.g., the Internet). The networks may also comprise a plurality of distinct networks that are adapted to operate together. Such networks are configured to provide communication between the nodes described herein. By way of example, and not limitation, these networks may include wireless media such as acoustic, RF, infrared and other wireless media. Furthermore, the networks may be portions of the same network or separate networks.

Figure 5:
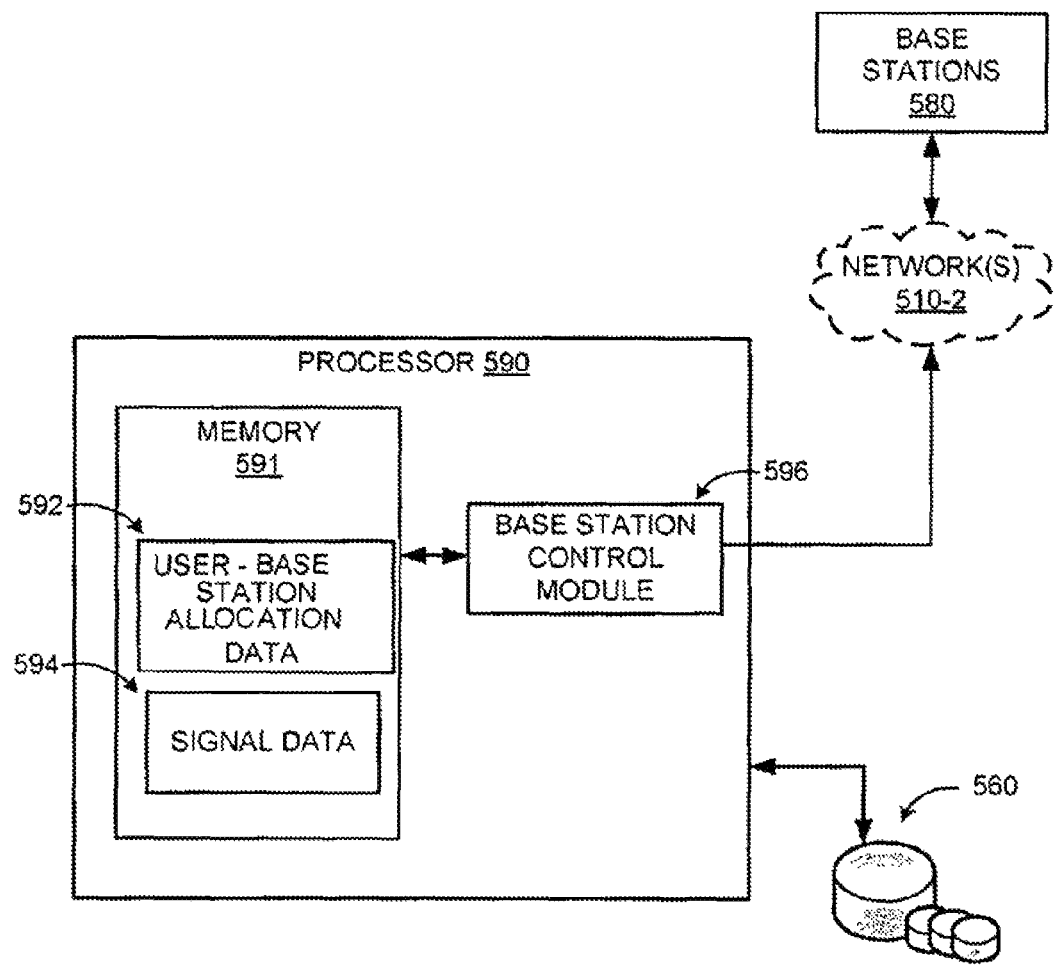
FIG. 5 illustrates a special purpose processor, which may be used to implement multi-resolution based PSD estimation.

FIG. 5 illustrates a special purpose processor, which may be used to implement multi-resolution based PSD estimation in accordance with at least some embodiments discussed within.

Processor 590 in diagram 500 may be part of a computing device (e.g., a controller for the cellular network) that is communicatively couple to one or more base stations 580, which may facilitate communication with end user devices through network(s) 510-2. Processor 590 may alternatively communicate with the base stations 580 over other networks such as wired networks, microwave networks, etc. Base stations 580 may include antenna and controllers, estimating multi-resolution based PSD to detect spectrum usage in highly dynamic environments and improve detection of subband edges. Processor 590 may store signal related data at one or more data stores 560.

Processor 590 may include a number of processing modules such as base station control module 596. User-base station allocation data 592 and signal data 594 may be used by processor 590 in conjunction with base station control module 596 for multi-resolution based PSD estimation. User-base station allocation data 592 and signal data 594 may be stored during processing in memory 591, which may be a cache memory of the processor 590 or in an external memory (e.g., memory external to processor 590). In some embodiments, processor 590 may also be implemented as part of a portable base station such as femto-cell base station.

Example embodiments may also include methods. These methods can be implemented in any number of ways, including the structures described herein. One such way is by machine operations of devices of the type described in the present disclosure. Another optional way is for one or more of the individual operations of the methods to be performed in conjunction with one or more human operators performing some of the operations while other operations are performed by machines. These human operators need not be collocated with each other, but each can be only with a machine that performs a portion of the program. In other examples, the human interaction can be automated such as by pre-selected criteria that are machine automated.

Figure 6:
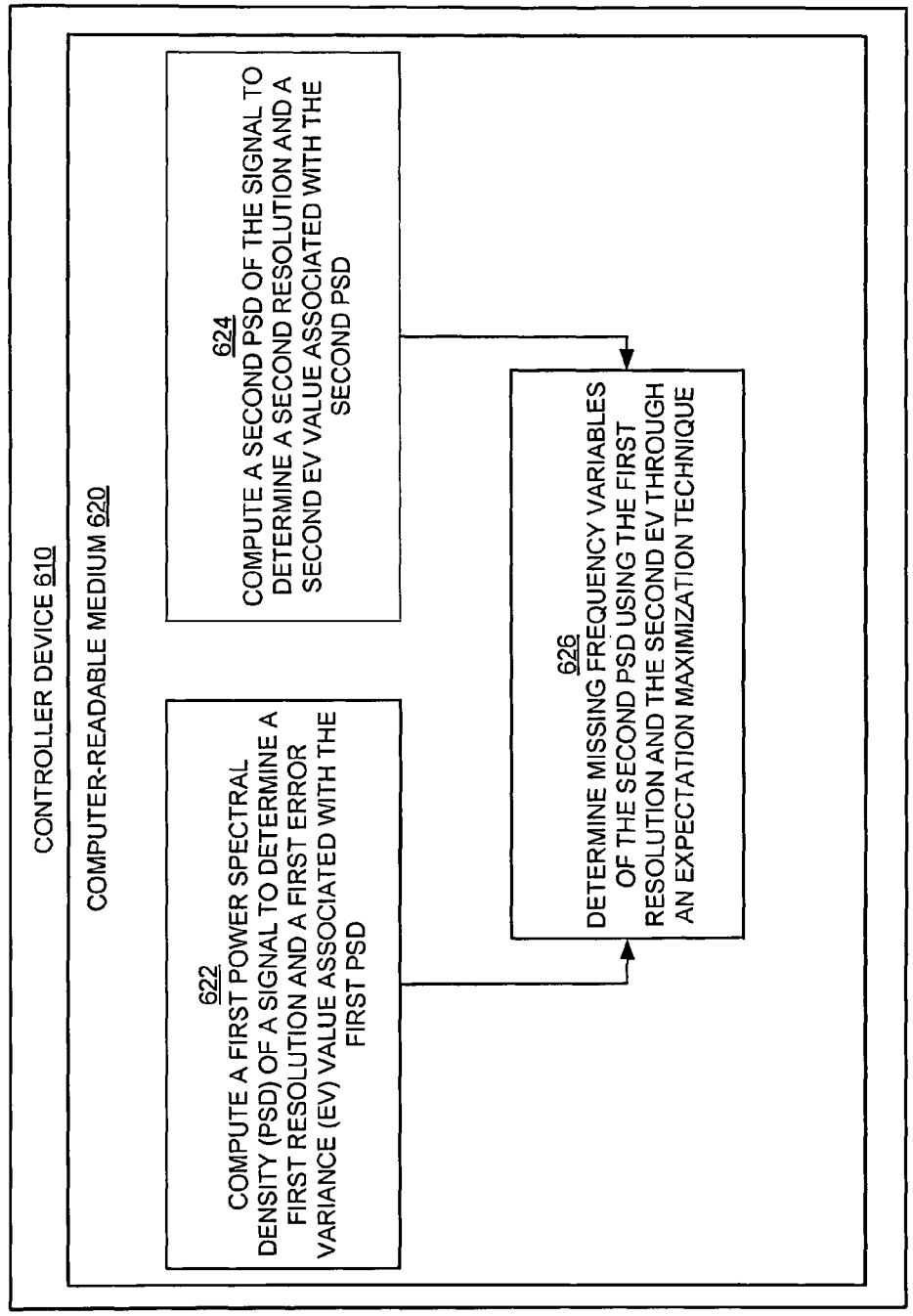
FIG. 6 is a flow diagram illustrating an example method for multi-resolution based PSD estimation.

FIG. 6 is a flow diagram illustrating an example method for multi-resolution based PSD estimation that may be performed by a computing device such as the device in FIG. 4 or the special purpose processor in FIG. 5, arranged in accordance with at least some embodiments described herein.

Thus, controller device 610 may be embodied as computing device 400, special purpose processor 590, or similar devices executing instructions stored in computer-readable medium 620 for performing the method. A process of multi-resolution based PSD estimation using expectation maximization technique in wireless networks may include one or more operations, functions or actions as is illustrated by one or more of blocks 622, 624, and/or 626.

Some example processes may begin with operation 622, "COMPUTE A FIRST POWER SPECTRAL DENSITY (PSD) OF A SIGNAL TO DETERMINE A FIRST RESOLUTION AND A FIRST ERROR VARIANCE (EV) VALUE ASSOCIATED WITH THE FIRST PSD". At operation 622, a network controller such as processor 590 of FIG. 5 may sample the signal with few segments to compute a high resolution and an associated high EV for the first PSD.

Operation 622 may be followed by operation 624, "COMPUTE A SECOND PSD OF THE SIGNAL TO DETERMINE A SECOND RESOLUTION AND A SECOND EV VALUE ASSOCIATED WITH THE SECOND PSD." At operation 624, the processor 590 may sample the signal with more segments to compute a low EV for the second PSD.

Operations 622 and/or 624 may be followed by operation 626, "DETERMINE MISSING FREQUENCY VARIABLES OF THE SECOND PSD USING THE FIRST RESOLUTION AND THE SECOND EV THROUGH AN EXPECTATION MAXIMIZATION TECHNIQUE." At operation 626, the processor 590 may determine an average value for the second PSD over consecutive non-overlapping segments of the signal.

The operations included in the process of FIG. 6 described above are for illustration purposes. Multi-resolution based PSD estimation may be implemented by similar processes with fewer or additional operations. In some examples, the operations may be performed in a different order. In some other examples, various operations may be eliminated. In still other examples, various operations may be divided into additional operations, or combined together into fewer operations. Although illustrated as sequentially ordered operations, in some implementations the various operations may be performed in a different order, or in some cases various operations may be performed at substantially the same time.

Figure 7:
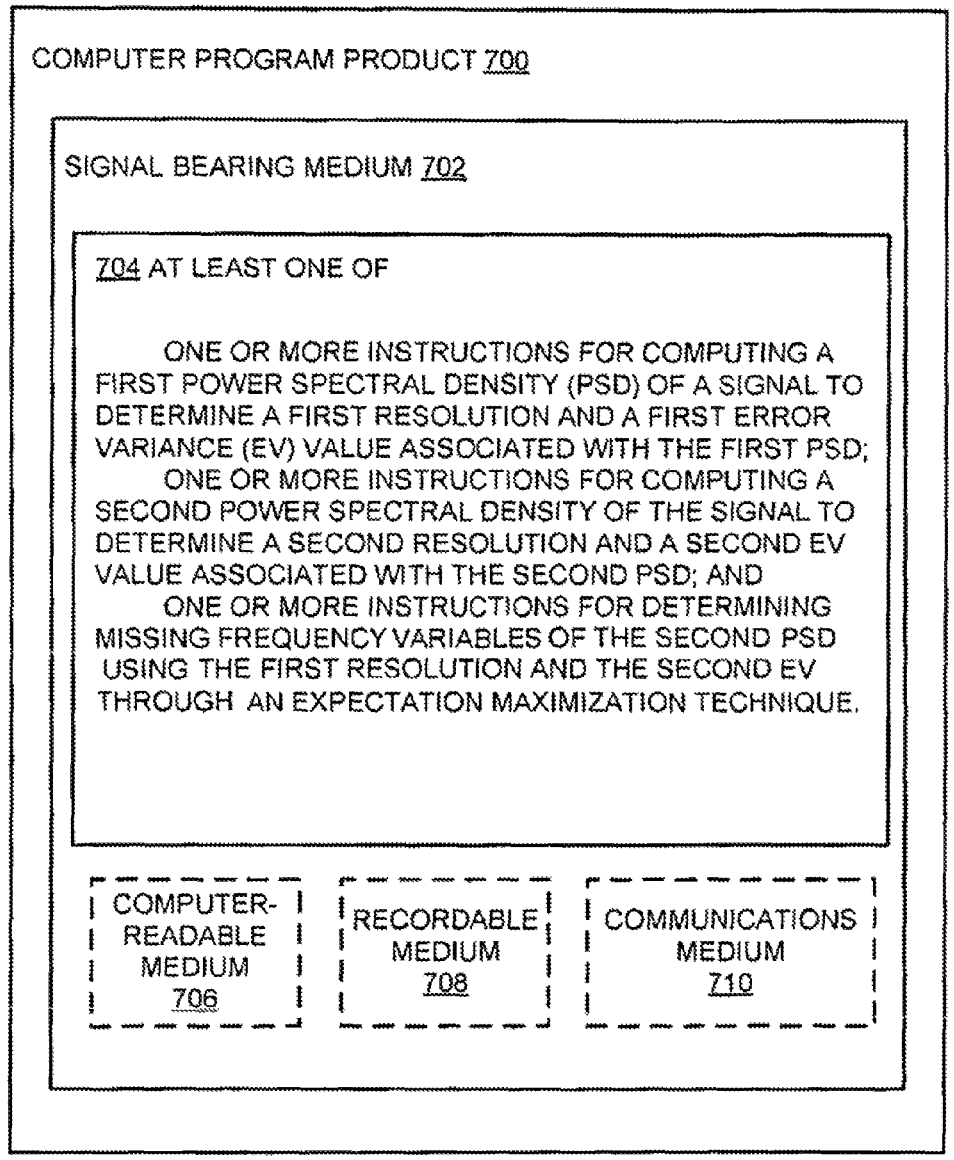
FIG. 7 illustrates a block diagram of an example computer program product for implementing multi-resolution based PSD estimation, all arranged in accordance with at least some embodiments described herein.

FIG. 7 illustrates a block diagram of an example computer program product for implementing multi-resolution based PSD estimation, arranged in accordance with at least some embodiments described herein.

In some examples, as shown in FIG. 7, computer program product 700 may include a signal bearing medium 702 that may also include machine readable instructions 704 that, when executed by, for example, a processor, may provide the functionality described above with respect to FIG. 1 through FIG. 5. Thus, for example, referring to processor 590, one or more of the tasks shown in FIG. 7 may be undertaken in response to instructions 704 conveyed to the processor 590 by medium 702 to perform actions associated with multi-resolution based PSD estimation as described herein. Some of those instructions may include computing a first PSD of a signal to determine a first resolution and a first error variance (EV) value associated with the first PSD; computing a second PSD of the signal to determine a second resolution and a second EV value associated with the second PSD; and determining missing frequency variables of the second PSD using the first resolution and the second EV through an expectation maximization technique as described previously.

In some implementations, signal bearing medium 702 depicted in FIG. 7 may encompass a computer-readable medium 706, such as, but not limited to, a hard disk drive, a Compact Disc (CD), a Digital Versatile Disk (DVD), a digital tape, memory, etc. In some implementations, signal bearing medium 702 may encompass a recordable medium 708, such as, but not limited to, memory, read/write (R/W) CDs, R/W DVDs, etc. In some implementations, signal bearing medium 702 may encompass a communications medium 710, such as, but not limited to, a digital and/or an analog communication medium (e.g., a fiber optic cable, a waveguide, a wired communications link, a wireless communication link, etc.) Thus, for example, computer program product 700 may be conveyed to the processor 590 by an RF signal bearing medium 702, where the signal bearing medium 702 is conveyed by a wireless communications medium 710 (e.g., a wireless communications medium conforming with the IEEE 802.11 standard).

According to some examples, a method for estimating multi-resolution based power spectral density (PSD) is described. An example wireless communication network and associated devices detecting spectrum usage in highly dynamic environments and improving detection of sub-band edges is described. An example method may include computing a first PSD of a signal to determine a first resolution and a first error variance (EV) value associated with the first PSD; computing a second PSD of the signal to determine a second resolution and a second EV value associated with the second PSD; and determining missing frequency variables of the second PSD using the first resolution and the second EV through an expectation maximization technique.

According to other examples, the method may also include determining an average value for the second PSD over consecutive non-overlapping segments of the signal; computing an integer value for the average value; assigning the integer value to a noise level value in response to determining the integer value as a mode value of the second PSD based, on a predetermined spectrum assumption of a cognitive radio associated with the signal; assigning the noise level value and the adjacent noise level value as approximate edge frequency values in response to detecting the noise level value and the adjacent noise level value bordering the area having a larger size in comparison to areas of other segments, and detecting exact edge frequency values of the signal by locating a minimum value and a maximum value of a first derivative of the second PSD within the noise level value and the adjacent noise level value.

According to further examples, the method may further include computing a probability distribution of the missing frequency variables based on existing variables of the second PSD for the expectation maximization technique; executing a maximization of the probability distribution based on a mean variance and a co-variance of the second PSD; repeating the maximization of the probability distribution to determine a convergence; and estimating the missing frequency variables based on the convergence.

According to other examples, a controller for estimating a multi-resolution based power spectral density (PSD) is described. The controller may include an expectation maximization module configured to compute a first PSD of a signal to determine a first resolution and a first error variance (EV) value associated with the first PSD, compute a second PSD of the signal to determine a second resolution and second EV value associated with the second PSD; determine missing frequency variables of the second PSD using the first resolution and the second EV through an expectation maximization technique; and determine an average value for the second PSD over consecutive non-overlapping segments of the signal.

According to some examples, the expectation maximization module may be further configured to compute an integer value for the average value; assign the integer value to a noise level in response to determining the integer value as a mode value of the second PSD based on a predetermined spectrum assumption of a cognitive radio associated with the signal; determine a sub-band energy level by computing an area under one of the segments associated with the second PSD between the noise level value and an adjacent noise level value; assign the noise level value and the adjacent noise level value as approximate edge frequency values in response to detecting the noise level value and the adjacent noise level value bordering the area having a larger size in comparison to areas of other segments; and detect exact edge frequency values of the signal by locating a minimum value and a maximum value of a first derivative of the second PSD within the noise level value and the adjacent noise level value.

According to further examples, a computing device for estimating multi-resolution based power spectral density (PSD) is described. The controller may manage an expectation management module. The controller may configured to computer a first PSD of a signal to determine a first resolution and a first error variance (EV) value associated with the first PSD; compute a second PSD of the signal to determine a second resolution and a second EV value associated with the second PSD; determine missing frequency variables of the second PSD using the first resolution and the second EV through an expectation maximization technique; determine an average value for the second PSD over consecutive non-overlapping segments of the signal; compute an integer value for the average value; and assign the integer value to a noise level value in response to determining the integer value as a mode value of the second PSD based on a predetermined spectrum assumption of a cognitive radio associated with the signal.

According to some other examples, the expectation maximization module may be further configured to determine a sub-band energy level by computing an area under one of the segments associated with the second PSD between the noise level value and an adjacent noise level value; assign the noise level value and the adjacent noise level value as approximate edge frequency values in response to detecting the noise level value and the adjacent noise level value bordering the area having a larger size in comparison to areas of other segments; detect exact edge frequency values of the signal by location a minimum value and a maximum value of a first derivative of the second PSD within the noise level value and the adjacent noise level value; compute a probability distribution of the missing frequency variables based on existing variables of the second PSD for the expectation maximization technique; execute a maximization of the probability distribution based on a mean variance and a co-variance of the second PSD; repeat the maximization of the probability distribution to determine a convergence; and estimate the missing frequency variables based on the convergence.

According to yet other examples, a computer-readable storage medium with instructions stored thereon for estimating multi-resolution based power spectral density (PSD) is described. The instructions may cause a method to be performed when executed, the method being similar to the methods described above.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowchart, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Glass Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of the disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, systems, or components, which can, of course, vary. It is also to be understood that the terminology used herein is for the purpose of describing particular embodiments only, and is not intended to be limiting.

In addition, those skilled in the art will appreciate the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such a as a floppy disk, a hard disk drive, a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless-communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops.

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architecture are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures to intermediate components. Likewise, any two components so associated may also be viewed as being "operably connected", or "operably coupled", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application.

The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of them, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cell refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for estimating multi-resolution based power spectral density (PSD), the method comprising:
   receiving, from a communication device, a set of wireless signals from a plurality of wireless devices;
   sampling, at a base station control module, the received set of wireless signals;
   computing, at the base station controller, a first PSD of a signal from the sampled set of wireless signals to determine a first resolution and a first error variance (EV) value associated with the first PSD;
   computing, at the base station controller, a second PSD of the signal to determine a second resolution and a second EV value associated with the second PSD;
   determining, at the base station controller, missing frequency variables of the second PSD using the first resolution and the second EV through an expectation maximization technique; and
   facilitating, at the base station controller, wireless communications between the plurality of wireless devices based on the determined missing frequency variables.

2. The method of claim 1, further comprising determining, at the base station controller, a sub-band energy level by computing an area under one of segments associated with the second PSD between noise level value and an adjacent noise level value.

3. The method of claim 2, further comprising assigning, at the base station controller, the noise level value and the adjacent noise level value as approximate edge frequency values in response to detecting the noise level value and the adjacent noise level value bordering the area having a larger size in comparison to areas of other segments.

4. The method of claim 3, further comprising detecting, at the base station controller, exact edge frequency values of the signal by locating a minimum value and a maximum value of a first derivative of the second PSD within the noise level value and the adjacent noise level value.

5. The method of claim 1, further comprising computing, at the base station controller, a probability distribution of the missing frequency variables based on existing variables of the second PSD for the expectation maximization technique.

6. The method of claim 5, further comprising executing, at the base station controller, a maximization of the probability distribution based on a mean variance and a co-variance of the second PSD.

7. The method of claim 6, further comprising repeating, at the base station controller, the maximization of the probability distribution to determine a convergence.

8. The method of claim 7, further comprising estimating, at the base station controller, missing frequency variables based on the convergence.

9. A controller integrated into a wireless base station for estimating multi-resolution based power spectral density (PSD), the controller comprising:
   an expectation maximization module configured to:
      receive, from a communication device, a set of wireless signals from a plurality of wireless devices;
      sample the received set of wireless signals;
      compute a first PSD of a signal from the sampled set of wireless signals to determine a first resolution and a first error variance (EV) value associated with the first PSD;

compute a second PSD of the signal to determine a second resolution and a second EV value associated with the second PSD;

determine missing frequency variables of the second PSD using the first resolution and the second EV through an expectation maximization technique;

determine an average value for the second PSD over consecutive non-overlapping segments of the signal; and facilitate wireless communications between the plurality of wireless devices based on the determined missing frequency variables.

10. The controller according to claim 9, wherein the expectation maximization module is further configured to:

determine a sub-band energy level by computing an area under one of the segments associated with the second PSD between noise level value and an adjacent noise level value.

11. The controller according to claim 10, wherein the expectation maximization module is further configured to:

assign the noise level value and the adjacent noise level value as approximate edge frequency values in response to detecting the noise level value and the adjacent noise level value bordering the area having a larger size in comparison to areas of other segments.

12. The controller according to claim 11, wherein the expectation maximization module is further configured to:

detect exact edge frequency values of the signal by locating a minimum value and a maximum value of a first derivative of the second PSD within the noise level value and the adjacent noise level value.

13. A computing device for estimating multi-resolution based power spectral density (PSD), the device comprising:

one or more communication devices configured to receive a set of wireless signals from a plurality of wireless devices; and a controller coupled to the one or more communication devices, to manage an expectation management module, the controller configured to:

receive, from the one or more communication devices, the set of wireless signals;

sample the received set of wireless signals;

compute a first PSD of a signal from the sampled set of wireless signals to determine a first resolution and a first error variance (EV) value associated with the first PSD;

compute a second PSD of the signal to determine a second resolution and a second EV value associated with the second PSD;

determine missing frequency variables of the second PSD using the first resolution and the second EV through an expectation maximization technique;

determine an average value for the second PSD over consecutive non-overlapping segments of the signal;

compute an integer value for the average value;

assign the integer value to a noise level value in response to determining the integer value as a mode value of the second PSD based on a predetermined spectrum assumption of a cognitive radio associated with the signal; and facilitate wireless communications between the plurality of wireless devices based on the determined missing frequency variables.

14. The device according to claim 13, wherein the controller is further configured to:

determine a sub-band energy level by computing an area under one of the segments associated with the second PSD between the noise level value and an adjacent noise level value.

15. The device according to claim 14, wherein the controller is further configured to:

assign the noise level value and the adjacent noise level value as approximate edge frequency values in response to detecting the noise level value and the adjacent noise level value bordering the area having a larger size in comparison to areas of other segments.

16. The device according to claim 15, wherein the controller is further configured to:

detect exact edge frequency values of the signal by locating a minimum value and a maximum value of a first derivative of the second PSD within the noise level value and the adjacent noise level value.

17. The device according to claim 16, wherein the controller is further configured to:

compute a probability distribution of the missing frequency variables based on existing variables of the second PSD for the expectation maximization technique.

18. The device according to claim 17, wherein the controller is further configured to:

execute a maximization of the probability distribution based on a mean variance and a co-variance of the second PSD.

19. The device according to claim 18, wherein the controller is further configured to:

repeat the maximization of the probability distribution to determine a convergence.

20. The device according to claim 19, wherein the controller is further configured to:

estimate the missing frequency variables based on the convergence.

* * * * *